United States Patent
Yamanaka et al.

(10) Patent No.: US 8,281,740 B2
(45) Date of Patent: Oct. 9, 2012

(54) SUBSTRATE PROCESSING APPARATUS, AND MAGNETIC RECORDING MEDIUM MANUFACTURING METHOD

(75) Inventors: Kazuto Yamanaka, Sagamihara (JP); Masahiro Shibamoto, Yokohama (JP); Ayumu Miyoshi, Zama (JP); Satoshi Hitomi, Fuchu (JP); David Djulianto Djayaprawira, Inagi (JP)

(73) Assignee: Canon Anelva Corporation, Kawasaki-shi (JP)

( * ) Notice: Subject to any disclaimer, the term of this patent is extended or adjusted under 35 U.S.C. 154(b) by 665 days.

(21) Appl. No.: 12/502,344

(22) Filed: Jul. 14, 2009

(65) Prior Publication Data

US 2010/0025363 A1    Feb. 4, 2010

(30) Foreign Application Priority Data

Jul. 31, 2008  (JP) .................................. 2008-197736
Sep. 29, 2008  (JP) .................................. 2008-249586

(51) Int. Cl.
   *C23C 16/00*    (2006.01)
(52) U.S. Cl. ............. 118/723 FI; 118/723 R; 427/248.1
(58) Field of Classification Search ............... 118/723 FI
   See application file for complete search history.

(56) References Cited

U.S. PATENT DOCUMENTS

| 6,176,932 B1 * | 1/2001 | Watanabe et al. ............. 118/719 |
| 7,314,667 B2 * | 1/2008 | Tregub et al. .................. 428/421 |
| 2006/0110629 A1 * | 5/2006 | Sato ........................... 428/848.3 |
| 2006/0115584 A1 * | 6/2006 | Hattori et al. .................. 427/127 |
| 2007/0137063 A1 * | 6/2007 | Grubbs et al. .................. 34/406 |
| 2008/0278865 A1 | 11/2008 | Tsunekawa et al. ...... 360/324.12 |

FOREIGN PATENT DOCUMENTS

JP    2005-056535    3/2005

* cited by examiner

*Primary Examiner* — Keath Chen
(74) *Attorney, Agent, or Firm* — Fitzpatrick, Cella, Harper & Scinto (57) ABSTRACT

The present invention provides a substrate processing apparatus capable of suppressing mutual contamination and/or damage of the insides of ion beam generators arranged opposite each other via a substrate, and a magnetic recording medium manufacturing method. A substrate processing apparatus according to an embodiment of the present invention includes a first ion beam generator that applies an ion beam to one surface to be processed of a substrate W, and a second ion beam generator that applies an ion beam to another surface to be processed, which are arranged opposite each other via the substrate W, and an area of a first grid in the first ion beam generator, and an area of a second grid in the second ion beam generator, each area corresponding to an opening of the substrate W, are occluded.

3 Claims, 9 Drawing Sheets

SUBSTRATE PROCESSING APPARATUS, AND MAGNETIC RECORDING MEDIUM MANUFACTURING METHOD

CROSS-REFERENCES TO RELATED APPLICATIONS

This application claims the benefit of priorities from Japanese Patent Application No. 2008-197736 filed Jul. 31, 2008 and Japanese Patent Application No. 2008-249586 filed Sep. 29, 2008, the entire contents of which is incorporated herein by reference.

BACKGROUND OF THE INVENTION

1. Field of the Invention

The present invention relates to a substrate processing apparatus that applies an ion beam to both surfaces of a substrate to process both substrate surfaces in manufacturing a magnetic recording disk such as a hard disk, and a magnetic recording medium manufacturing method.

2. Related Background Art

Manufacture of a magnetic recording disk such as a hard disk is roughly divided into the preceding process of performing formation of an underlayer, formation of a magnetic film for a recording layer, and formation of a protective film for protecting the recording layer, and the following process of performing, e.g., formation of a lubricant layer on the surface of the substrate on which the protective film has been formed.

In general, a magnetic recording disk has a recording layer on both surfaces of a substrate, and thus, in the aforementioned processes, various kinds of processing are performed on both surfaces of the substrate.

As a technique for processing both surfaces of a substrate as described above, for example, a technique that provides an ion gun on both sides of a substrate to emit and apply an ion beam formed from ionized argon gas from the ion gun to each surface of the substrate is disclosed (Japanese Patent Application Laid-Open No. 2005-56535).

However, substrate processing techniques in which ion guns (ion beam generators) are arranged opposite each other on the opposite surfaces of a substrate, as in Japanese Patent Application Laid-Open No. 2005-56535, have a problem in that the opposed ion beam generators are mutually affected by their ion beams.

In particular, when using a substrate having an opening in its center like a substrate for a magnetic recording disk and applying an ion beam to both surfaces of the substrate, an ion beam from one of the ion beam generators enters the other ion beam generator through the opening of the substrate. Consequently, there are problems in that the insides of the beam generators are mutually contaminated, and/or damaged.

SUMMARY OF THE INVENTION

Therefore, the present invention has been made in views of the above-mentioned circumstances, and an object of the present invention is to provide a substrate processing apparatus capable of suppressing mutual contamination and/or damage of the insides of ion beam generators arranged opposite each other via a substrate, and a magnetic recording medium manufacturing method.

The present invention that has been made to achieve the above object includes the following configuration.

The present invention provides a substrate processing apparatus capable of applying an ion beam to a substrate including an opening to perform predetermined processing, the apparatus comprising: a first ion beam generator including a first ion extraction mechanism for extracting ions in a plasma; and a second ion beam generator including a second ion extraction mechanism for extracting ions in a plasma, the second ion beam generator being arranged opposite the first ion beam generator, wherein each of the first ion beam generator and the second ion beam generator is arranged so as to apply an ion beam to a region between the first ion beam generator and the second ion beam generator; the first extraction mechanism includes a first grid, and the second extraction mechanism includes a second grid; and when a substrate carrier that holds the substrate is arranged in the region, at least a part of an area of each of the first grid and the second grid, the area corresponding to the opening of the substrate, is occluded so as to prevent an ion beam from passing through the at least a part of the area.

Also, the present invention provides A substrate processing apparatus capable of applying an ion beam to a substrate including an opening to perform predetermined processing, the apparatus comprising: a first ion beam generator including a first ion extraction mechanism for extracting ions in a plasma; and a second ion beam generator including a second ion extraction mechanism for extracting ions in a plasma, the second ion beam generator being arranged opposite the first ion beam generator, wherein each of the first ion beam generator and the second ion beam generator is arranged so as to apply an ion beam to a region between the first ion beam generator and the second ion beam generator; the first extraction mechanism includes a first grid, and the second extraction mechanism includes a second grid; the first grid includes a first occluded region, and the second grid includes a second occluded region; and when a substrate carrier that holds the substrate is arranged in the region, the first and second occluded regions are positioned so that at least a part of the opening is positioned between the first and second occluded regions.

According to the present invention, at least a part of an area of a first grid in a first ion beam generator and at least a part of an area of a second grid in a second ion beam generator, each area corresponding to an opening of a substrate, are occluded so as to prevent an ion beam from passing through. Accordingly, entrance of ion beams to the opposed ion beam generators through the opening of the substrate will be prevented or reduced, enabling suppression of mutual contamination or damage of the insides of the first and second ion beam generators arranged opposite each other.

DESCRIPTION OF THE PREFERRED EMBODIMENTS

Hereinafter, embodiments of the present invention will be described with reference to the drawings. However, the present invention will not be limited to the present embodiments.

Figure 1:
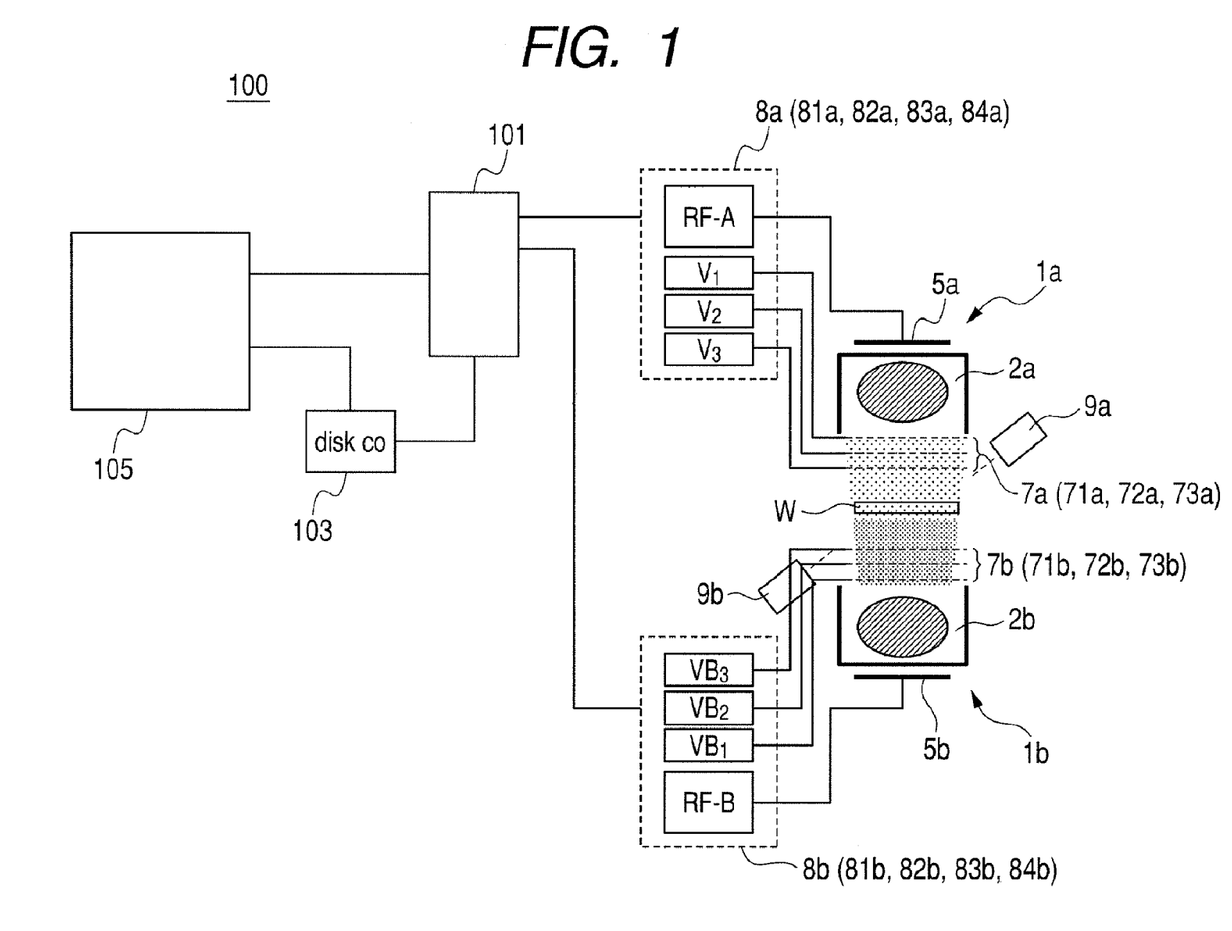
FIG. 1 is a block diagram illustrating a configuration of a substrate processing apparatus according to an embodiment of the present invention, viewed from above.

A substrate processing apparatus according to an embodiment of the present invention will be described with reference to FIG. 1. FIG. 1 is a block diagram illustrating the configuration of the substrate processing apparatus according to the present embodiment, viewed from above.

As illustrated in FIG. 1, a substrate processing apparatus 100 mainly includes a substrate (wafer) W, first and second ion beam generators 1a and 1b arranged opposite each other via the substrate W, a control unit 101, a counter 103 and a computer interface 105.

The substrate W in the present embodiment is a substrate for a magnetic recording medium such as a hard disk, and in general, has an opening formed in the center of the substantially-circular disk-shaped substrate. The substrate W is held in an upright position along a vertical direction by a substrate carrier (not illustrated).

The first ion beam generator 1a and the second ion beam generator 1b are arranged opposite each other via the substrate W so as to face the opposite surfaces of this substrate W. In other words, each of the first ion beam generator 1a and the second ion beam generator 1b is arranged so as to apply an ion beam to a region therebetween, and the substrate carrier that holds the substrate W including the opening is arranged in the region. In the configuration illustrated in FIG. 1, the ion beam emission surfaces of the first and second ion beam generators 1a and 1b and the surfaces to be processed of the substrate W are arranged so that they are substantially parallel to each other.

The first ion beam generator 1a includes an electrode 5a, a discharge chamber 2a for generating a plasma, and an extraction electrode 7a (electrodes 71a, 72a and 73a from the discharge chamber side) as a mechanism for extracting ions in the plasma. The electrodes 71a, 72a and 73a are connected respectively to voltage sources 81a, 82a and 83a so that each of them can independently be controlled. In the vicinity of the extraction electrode 7a, a neutralizer 9a is provided. The neutralizer 9a is configured to emit electrons to neutralize an ion beam emitted from the ion beam generator 1a.

A processing gas such as argon (Ar) is supplied into the discharge chamber 2a by gas introduction means (not illustrated). Ar is supplied into the discharge chamber 2a by the gas introduction means, and RF power is applied from a RF source 84a to an electrode 5a, thereby generating a plasma. Ions in the plasma are extracted by the ion extraction electrode 7a to perform etching on the substrate W.

A description of the second ion beam generator 1b will be omitted since the second ion beam generator 1b has a configuration similar to that of the ion beam generator 1a described above.

The control unit 101, which is connected to the voltage sources 8a in the ion beam generator 1a and voltage sources 8b in the ion beam generator 1b, controls the respective voltage sources 8a and 8b. The counter 103, which is connected to the control unit 101, is configured so that it can count the number of substrates processed by the ion beam generators 1a and 1b, and upon a predetermined count (for example, 1000) being reached, instruct the control unit 101 to start cleaning.

The computer interface 105, which is connected to the control unit 101 and the counter 103, is configured so that cleaning conditions (processing time, etc.) can be input by an apparatus user.

Next, an ion beam generator 1 (1a and 1b) will be described in detailed with reference to FIGS. 2, 3A and 3B.

Figure 2:
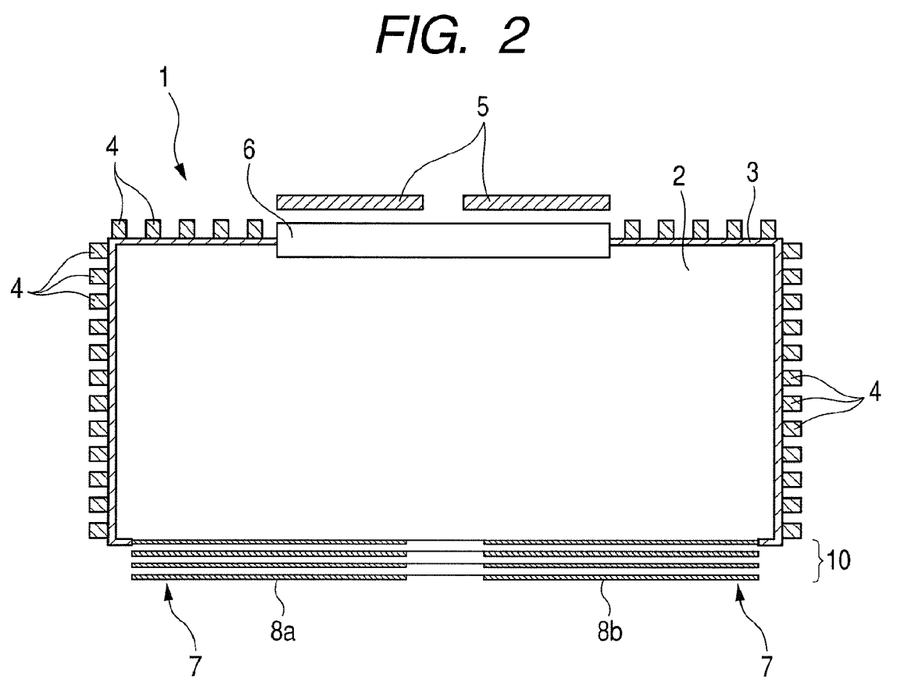
FIG. 2 is a schematic cross-sectional view of a structure of an ion beam generator according to an embodiment of the present invention.

FIG. 2 is a schematic cross-sectional view of the structure of an ion beam generator. FIG. 3A is a schematic diagram of a grid in the ion beam generator 1a. Also, FIG. 3B is a schematic diagram of a grid in the ion beam generator 1b. Since the first and second ion beam generators 1a and 1b has a common structure, the description will be provided with branch symbols, a and b, omitted as appropriate.

As illustrated in FIG. 2, the ion beam generator 1 includes a discharge chamber 2 for confining a plasma volume therein. The pressure of this discharge chamber 2 is ordinarily maintained in the range of approximately $10^{-4}$ Pa ($10^{-5}$ millibars) to approximately $10^{-2}$ Pa ($10^{-3}$ millibars). The discharge chamber 2 is defined by a plasma confinement vessel 3, and around the periphery thereof, multipolar magnetic means 4 for trapping ions released in the discharge chamber 2 as a result of formation of a plasma is arranged. This magnetic means 4 usually include a plurality of rod-like permanent magnets.

In a configuration, using a plurality of relatively-long bar magnets with alternately different polarities, N—S cycles are generated only along one axis. In another configuration, a "checker board" configuration is used. In this configuration, shorter magnets are used, and N—S cycles extend on a plane formed by two axes running at right angles to each other.

RF power is provided by RF coil means 5 to the back wall of the plasma confinement vessel 3 and supplied to the discharge chamber 2 via a dielectric RF power coupling window 6.

Figure 3A:
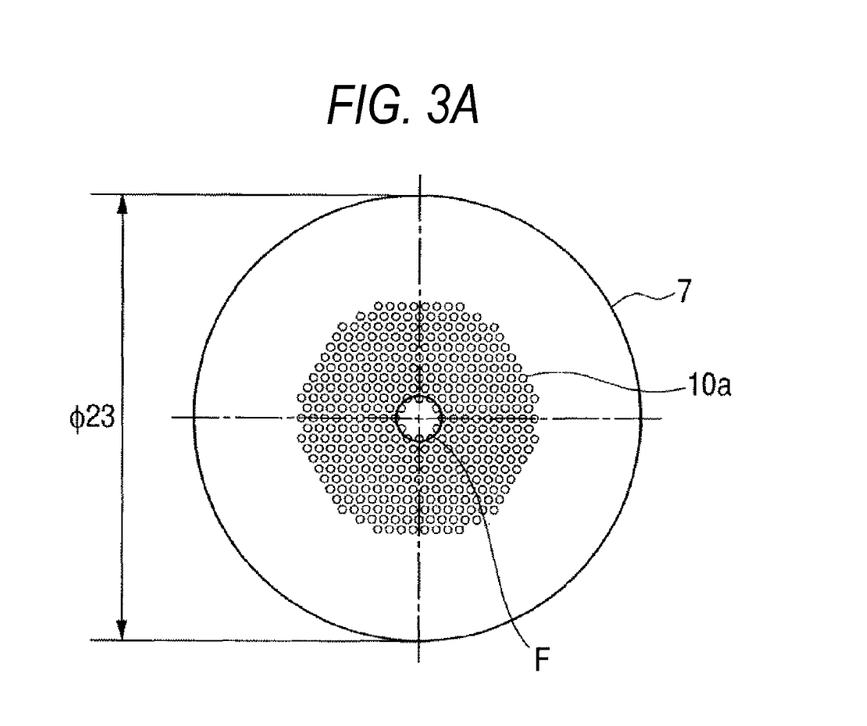
FIG. 3A is a schematic diagram of a grid in an ion beam generator according to an embodiment of the present invention.
Figure 3B:
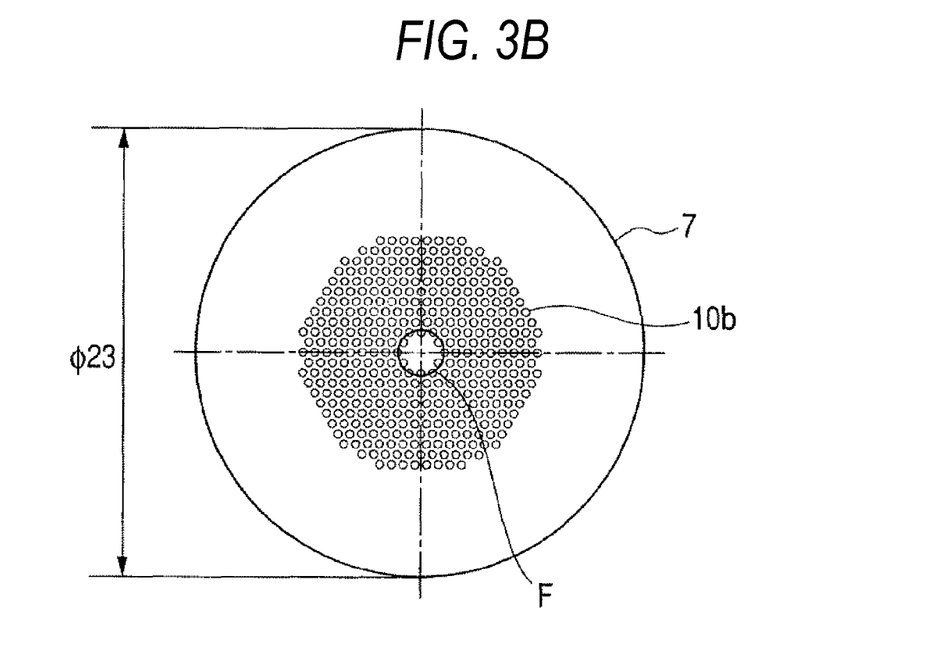
FIG. 3B is a schematic diagram of a grid in an ion beam generator according to an embodiment of the present invention.

The front wall of the plasma confinement vessel 3 is provided with an ion beam emission surface (see FIGS. 3A and 3B). The emission surface includes an extraction mechanism (extraction electrode) 7 that extracts ions from a plasma formed in the discharge chamber 2 and accelerates the ions extracted from the plasma confinement vessel 3 in the form of an ion beam. The extraction electrode 7, as illustrated in FIGS. 3A and 3B, includes a combination of a plurality of grid structures. Each grid structure includes a plurality of mutually adjacent pores. In the present embodiment, a plurality of pores is arranged in a matrix in the center portion of each of the grids 10a and 10b, exhibiting a substantially hexagonal shape.

The present embodiment has a characteristic in that it provides a structure that when a substrate carrier that holds the substrate W is arranged, an area of the grid 10a in the first ion beam generator 1a and an area of the grid 10b in the second ion beam generator 1b, which correspond to the opening of the substrate W, are occluded to prevent an ion beam from passing through.

More specifically, in the present embodiment, as illustrated in FIGS. 3A and 3B, an occluded region F, which is occluded to prevent ion beam emission, is formed in the center portion of each of the first grid 10a and the second grid 10b. In other words, the occluded region F formed in each of the first grid 10a and the second grid 10b is positioned so that at least a part of the opening of the substrate W is positioned between the occluded regions F. Consequently, it is possible to prevent or reduce substances removed by ion beams generated by the opposed ion beam generators 1a and 1b passing through the center opening of the substrate W and mutually contaminating these generators 1a and 1b.

In particular, the center portion of each of the first grid 10a and the second grid 10b is in communication with the opening of the substrate W, and thus, formation of the occluded regions F in these center portions is effective regardless of the arrangement of pores in the first grid 10a and the second grid 10b. The size of each occluded region F can arbitrarily be determined according to the substrate size and the center opening of the substrate so as to occlude at least a part of the area corresponding to the opening of the substrate.

Referring back to FIG. 1, the extraction electrode 7a includes three electrodes 71a, 72a and 73a from the discharge chamber 2a side, and each electrode is configured so that its voltage can independently be controlled. In the present embodiment, the electrode 71a is controlled to have a positive potential, the electrode 72a is controlled to have a negative potential, and the electrode 73a is controlled to have a ground potential.

A plurality of ion beams are emitted from the ion extraction electrode 7, forming an ion beam column. An emission surface is arranged on a swivel mount (not illustrated) enabling angle adjustment of ion beams emitted from the application surface. Accordingly, the shape and direction of the ion beam column can be controlled by adjusting the angle of each ion beam.

When the first ion beam generator 1a is used in a vacuum sputtering apparatus, a processing gas such as Ar is introduced into the discharge chamber 2a via the gas introduction means (not illustrated). Accordingly, upon RF power being supplied from the RF coil means 5a, a plasma is formed. Ordinarily, the plasma is confined in the discharge chamber 2a. A part of the plasma is adjacent to the ion beam extraction electrodes 71a, 72a and 73a. The extraction electrodes 71a, 72a and 73a include a combination of a plurality of grid structures that extract ions from the discharge chamber 2a into the grid 10a and accelerate the ions through the grid 10a.

Similarly, an extraction electrode 7b includes three electrodes 71b, 72b, 73b from the discharge chamber 2b side, and each electrode is configured so that its voltage can independently be controlled. In the present embodiment, the electrode 71b is controlled to have a positive potential, the electrode 72b is controlled to have a negative potential, and the electrode 73b is controlled to have a ground potential.

A plurality of ion beams are emitted from the ion extraction electrode 7, forming an ion beam column. An emission surface is arranged on a swivel mount (not illustrated) enabling angle adjustment of ion beams emitted from the emission surface. Accordingly, the shape and direction of the ion beam column can be controlled by adjusting the angle of each ion beam.

When the ion beam generator 1b is used in a vacuum sputtering apparatus, a processing gas such as Ar is introduced into the discharge chamber 2b via gas introduction means (not illustrated). Accordingly, upon RF power being supplied from RF coil means 5b, a plasma is formed. Ordinarily, the plasma is confined in the discharge chamber 2b. A part of the plasma is adjacent to the ion beam extraction electrodes 71b, 72b and 73b. The extraction electrodes 71b, 72b and 73b includes a combination of a plurality of grid structures that extract ions from the discharge chamber 2b into the grid 10b and accelerate the ions through the grid 10b.

Next, an operation of the substrate processing apparatus 100 according to the present embodiment will be described with reference to FIG. 1.

First, the substrate carrier that holds the substrate W is arranged in the region between the first ion beam generator 1a and the second ion beam generator 1b so that at least a part of the opening of the substrate W is positioned between the occluded region F of the grid 10a and the occluded region F of the grid 10b. Next, an ion beam is applied from the first ion beam generator 1a to one surface to be processed of the substrate W, thereby the one surface to be processed of the substrate W being processed. Similarly, an ion beam is applied from the second ion beam generator 1b to the other surface to be processed of the substrate W, thereby the other surface to be processed of the substrate W being processed. Accordingly, the opposed ion beam generators may mutually be affected by their ion beams. In particular, when ions beam are applied to a substrate W with an opening formed in its center portion like a substrate for a magnetic recording disk, an ion beam from one ion beam generator 1a (1b) enters the other ion beam generator 1b (1a) through the opening of the substrate W.

However, in the substrate processing apparatus 100 according to the present embodiment, the area of each of the grid 10a in the first ion beam generator 1a and the grid 10b in the second ion beam generator 1b, which corresponds to the opening of the substrate W, is occluded so as to prevent an ion beam from passing through. Accordingly, it is difficult for the ion beams to pass through the opening of the substrate W, and even supposing that an ion beam has passed through the opening of the substrate W, the pores in the grid the ion beam bumps into are occluded, reducing or preventing entrance of the ion beam to the opposite ion beam generator 1a or 1b.

As described above, an ion beam has a high directivity, and even supposing that an ion beam goes around the substrate W and reaches the opposite grid, the ion beam cannot enter the ion beam generator unless it passes through the pores in the grid.

As described above, the substrate processing apparatus 100 according to the present embodiment enables suppression of mutual contamination and/or damage of the insides of the first ion beam generator 1a and the second ion beam generator 1b arranged opposite each other.

Figure 4:
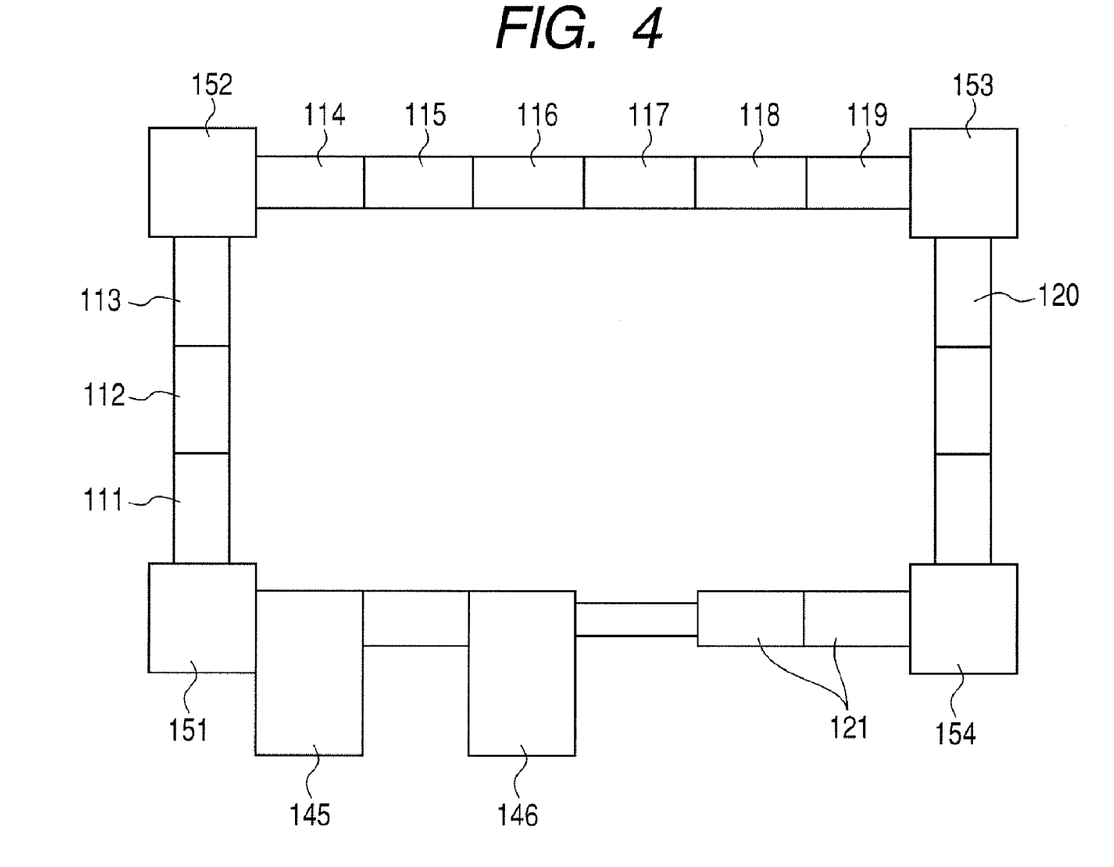
FIG. 4 is a schematic configuration diagram of a manufacturing apparatus used in a magnetic recording medium manufacturing method according to an embodiment of the present invention.

FIG. 4 is a schematic configuration diagram of a manufacturing apparatus using a magnetic recording medium manufacturing method according to an embodiment of the present invention.

The manufacturing apparatus used in a magnetic recording medium manufacturing method according to an embodiment of the present invention, as illustrated in FIG. 4, is an in-line-type manufacturing apparatus including a plurality of chambers 111 to 121, . . . that can be evacuated, the plurality of chambers 111 to 121, . . . connected in a rectangular shape with no ends. In the chambers 111 to 121 . . . , a carrier path for carrying a substrate to an adjacent vacuum chamber is formed, and the substrate is sequentially subjected to processing in the respective vacuum chambers during going around in the manufacturing apparatus. The direction of carrying the substrate is changed in direction change chambers 151 to 154: the direction of carrying the substrate that has linearly been carried through the chambers is changed by 90 degrees, and the substrate is delivered to the next chamber. Also, the substrate is introduced by a load lock chamber 145 into the manufacturing apparatus, and upon the end of the processing, is carried out of the manufacturing apparatus by an unload lock chamber 146. Also, like the chambers 121, a plurality of chambers that can perform the same processing may be consecutively arranged to perform the same processing plural times by dividing processing into a plurality of processing. Consequently, even time-consuming processing can be performed without extending the takt time. In FIG. 4, while a plurality of chambers are provided only for the chambers 121, a plurality of chambers may be arranged for another chamber.

Figure 5:
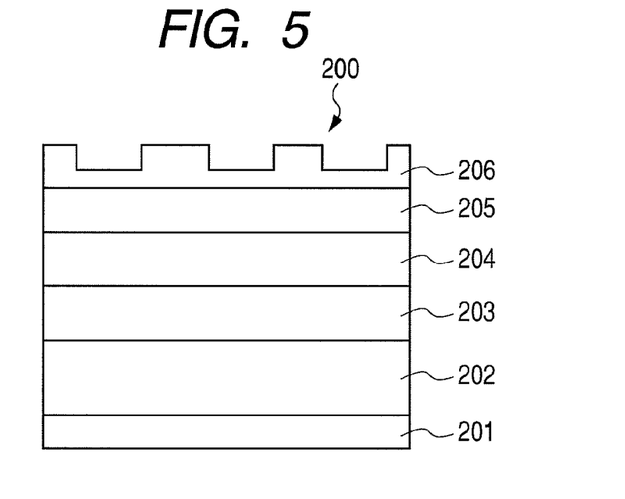
FIG. 5 is a schematic diagram of a stack to be processed by a magnetic recording medium manufacturing apparatus according to an embodiment of the present invention.

FIG. 5 is a schematic diagram of a stack to be processed by a magnetic recording medium manufacturing apparatus according to an embodiment of the present invention. In the present embodiment, a stack is formed on both of opposed surfaces of a substrate 201. However, in FIG. 5, for sake of simplicity of the drawing and description, a description will be provided focusing on the processing of the stack formed on one side of the substrate 201, and a description of the stack formed on the other side and the processing performed on the stack will be omitted. Accordingly, in FIGS. 6 to 11, a description will also be provided for processing performed on the stack formed on one side of the substrate 201, but similar processing is performed also on the stack formed on the other side.

As illustrated in FIG. 5, a stack 200, which is in the midst of processing to form a DTM (discrete track medium), includes the substrate 201, a soft magnetic layer 202, an underlayer 203, a recording magnetic layer 204, a mask 205 and a resist layer 206. The stack 200 is introduced into the manufacturing apparatus illustrated in FIG. 4. For the substrate 201, for example, a glass substrate or aluminum substrate having a diameter of 2.5 inches (65 mm) can be used. Although the soft magnetic layer 202, the underlayer 203, the recording magnetic layer 204, the mask 205 and the resist layer 206 are formed on both of opposed surfaces of the substrate 201, as mentioned above, for sake of simplicity of the drawing and description, illustration and description of the stack formed on one side of the substrate 201 are omitted.

The soft magnetic layer 202 is a layer that serves as a yoke for the recording magnetic layer 204, and contains a soft magnetic material such as an Fe alloy or a Co alloy. The underlayer 203 is a layer for orienting an easy axis of the recording magnetic layer 204 to a vertical direction (the stacking direction of the stack 200), and contains, e.g., a stack of Ru and Ta. This recording magnetic layer 204 is a layer that is magnetized in a direction perpendicular to the substrate 201, and contains, e.g., a Co alloy.

Also, the mask 205 is provided for forming trenches in the recording magnetic layer 204, and, e.g., diamond-like carbon (DLC) can be used for the mask 205. The resist layer 206 is a layer for transferring a trench pattern to the recording magnetic layer 204. In the present embodiment, a trench pattern is transferred to the resist layer by means of nanoimprinting, and the substrate is introduced into the manufacturing apparatus illustrated in FIG. 4 in this state.

The trench pattern may be transferred by exposure and development, rather than nanoimprinting.

Figure 6:
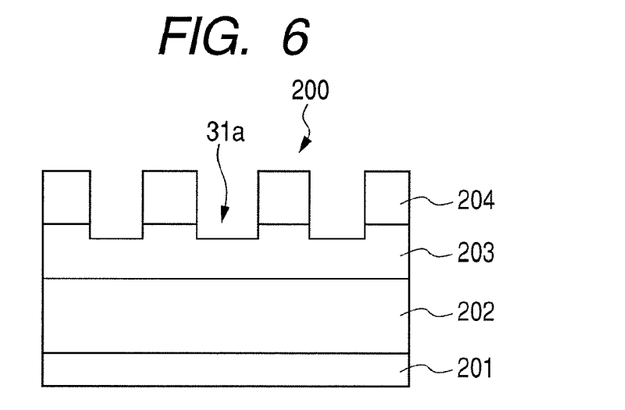
FIG. 6 is a schematic diagram for step-by-step illustration of a magnetic recording medium manufacturing method according to an embodiment of the present invention.

In the manufacturing apparatus illustrated in FIG. 4, the resist layer 206 in the trenches is removed in the first chamber 111 by means of reactive ion etching, and then, the mask 205 exposed in the trenches is removed in the second chamber 112 by means of reactive ion etching. Subsequently, the recording magnetic layer 204 exposed in the trenches is removed in the third chamber 113 by means of ion beam etching, thereby forming the recording magnetic layer 204 into a protruded and recessed pattern in which respective tracks are radially spaced from one another. For example, the pitch (the trench width and the track width) in this case is 70 to 100 nm, and the trench width is 20 to 50 nm, and the thickness of the recording magnetic layer 204 is 4 to 20 nm. As described above, the process of forming the recording magnetic layer 204 into a protruded and recessed pattern is performed. Subsequently, the resist layer 206 and the mask 205 left on the surface of the recording magnetic layer 204 are removed in the fourth chamber 114 and the fifth chamber 115 by means of reactive ion etching, and as illustrated in FIG. 6, the substrate enters a state in which the recording magnetic layer 204 is exposed. For a method for changing the stack 200 from the state illustrated in FIG. 5 to the state illustrated in FIG. 6, a conventionally-known method can be used.

Next, the process of depositing a nonmagnetic material as a stop layer and the process of depositing a buried layer, which includes a nonmagnetic material, and filling recesses of the recording magnetic layer with the buried layer, and the etching process of removing an extra portion of the buried layer by means of etching will be described with reference to FIGS. 6 to 12. FIGS. 6 to 11 are schematic diagrams for step-by-step illustration of a magnetic recording medium manufacturing method according to an embodiment of the present invention, and FIG. 12 is a flowchart of the method.

Figure 7:
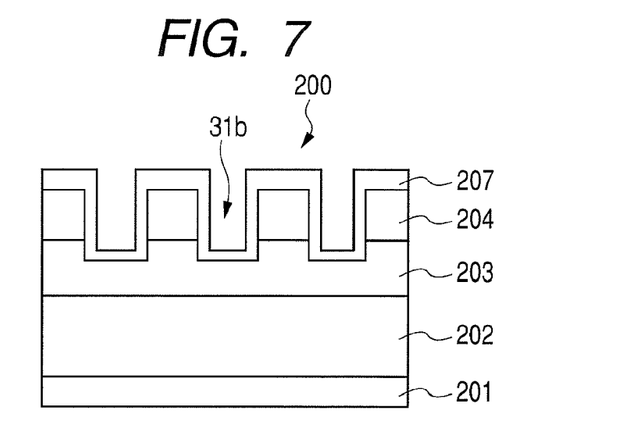
FIG. 7 is a schematic diagram for step-by-step illustration of a magnetic recording medium manufacturing method according to an embodiment of the present invention.
Figure 12:
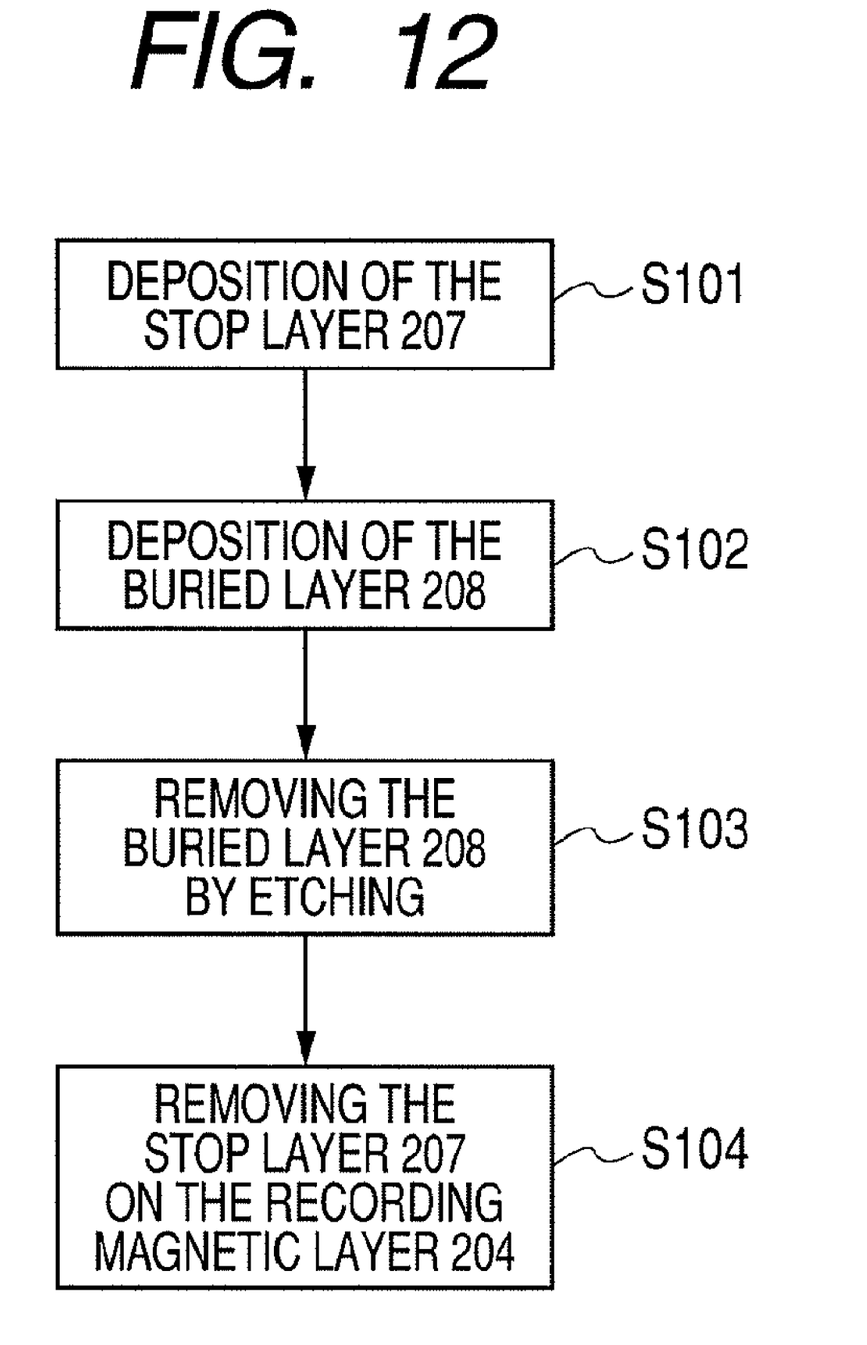
FIG. 12 is a flowchart illustrating a magnetic recording medium manufacturing method according to an embodiment of the present invention.

As illustrated in FIG. 7, after making the recording magnetic layer 204 of the stack 200 be exposed, a stop layer 207 is successively formed on the surface of the recording magnetic layer 204 formed in a protruded and recessed pattern in a stop layer formation chamber 116 (FIG. 12: step S101). The stop layer formation chamber 116 also serves as a first deposition chamber for depositing a nonmagnetic conductive layer on the recording magnetic layer 204 formed in a protruded and recessed pattern. For the stop layer 207, a material that exhibits a lower etching rate for etching using, e.g., ion beam etching relative to that of a buried layer 208, which will be described later, is used in consideration of the relationship between the stop layer 207 and the buried layer 208.

Figure 13:
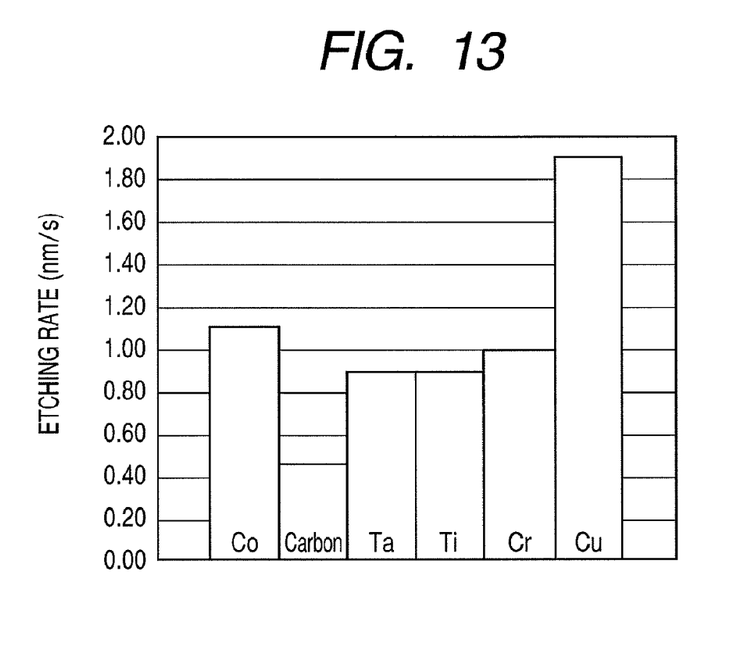
FIG. 13 is an illustration of etching rates of respective materials in ion beam etching (IBE), according to an embodiment of the present invention.

FIG. 13 is an illustration of etching rates of respective materials in ion beam etching (IBE). As illustrated in FIG. 13, carbon (C) exhibits an etching rate of no more than half that of copper (Cu), which is a diamagnetic material, or Co, which is used for the recording magnetic layer 204. Therefore, when removing the buried layer 208 by means of IBE, it is preferable to use a material containing carbon as its main component, for the stop layer 207. Furthermore, it is most preferable to use carbon from among these materials. Also, although not illustrated, other examples of materials having a low etching rate may include, e.g., MgO.

Also, as described later, use of conductive carbon is preferable because when forming the buried layer 208, it is easy to apply a bias voltage to draw the buried layer 208 into trenches 31b, which are recesses. In other words, a conductive layer is formed by forming the stop layer 207, which contains carbon as its main component, on the recording magnetic layer 204.

Furthermore, when a nonmetal material such as carbon is used, it can be removed by reactive ion etching using oxygen, enabling prevention of corrosion of the recording magnetic layer 204 as in the case of using, e.g., $CF_4$, and thus, use of carbon is also preferable in this regard.

Furthermore, when a nonmagnetic conductive layer is formed using a nonmagnetic material such as carbon, even if it is left in the trenches 31a together with the buried layer 208, it does not affect recording/reading to/from the recording magnetic layer 204, and thus, it is preferable to use carbon in this regard. Examples of the nonmagnetic material, other than carbon, may include, e.g., Ta, Ti, and alloys that have lost their ferromagnetic property in their entirety as a result of containing Ta and/or Ti.

Conductive carbon having an electrical resistivity (approximately no more than 1 $\Omega$cm) much smaller than that of DLC ($10^{10}$ to $10^{13}$ $\Omega$cm) can easily be deposited by means of, for example, sputtering or CVD. When sputtering is used for the deposition, for example, such deposition can be performed by performing DC sputtering under a low pressure (around 0.8 Pa) or high pressure condition using a high-purity (99.99%) C (carbon) target. Alternatively, RF sputtering may be used. Also, when such deposition is performed by means of CVD, the deposition is performed by means of capacitively-coupled CVD in which $C_2H_4$ gas is introduced, with no or almost no bias voltage applied to the substrate. Carbon having no conductivity, such as, for example, DLC, can also be used.

Figure 8:
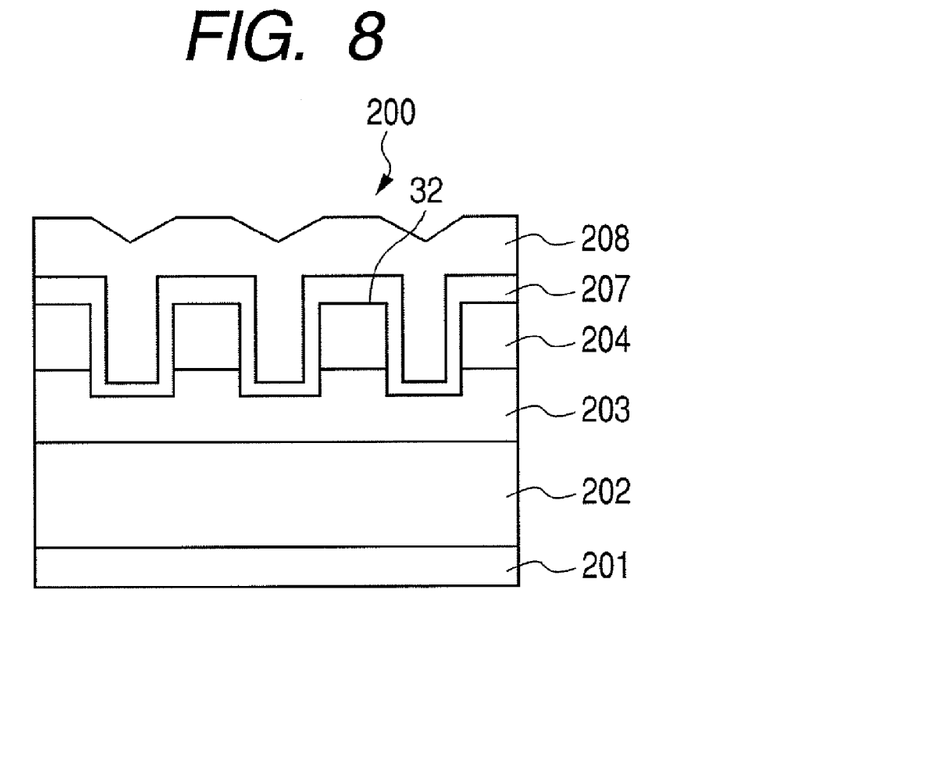
FIG. 8 is a schematic diagram for step-by-step illustration of a magnetic recording medium manufacturing method according to an embodiment of the present invention.

Although the stop layer 207 is not necessarily formed down to the bottoms and/or wall surfaces of the trenches 31, which are recesses, it is preferable to seamlessly form the stop layer 207 also on the bottom surfaces and the wall surfaces because it becomes easy to apply a bias voltage. Next, as illustrated in FIG. 8, the buried layer 208 is deposited on the surfaces of the trenches 31a, which are recesses of the recording magnetic layer 204, in a buried layer formation chamber 117 so that the trenches 31b with the stop layer 207 formed therein are filled (FIG. 12: step S102). The buried layer formation chamber 117 serves as a second deposition chamber for depositing the buried layer 208, which includes a non-magnetic material, on the non-magnetic conductive layer and filling the trenches with the buried layer 208. For the buried layer 208, a non-magnetic material that does not affect recording/reading to/from the recording magnetic layer 204, the material having an etching rate when removing an excessively-formed portion of the buried layer 208 higher than that of the stop layer 207, is used in consideration of the relationship with the stop layer 207 as described above. For the buried layer 208, for example, Cr or Ti or an alloy thereof (for example, CrTi) can be used. For the non-magnetic material, a material containing a ferromagnetic material may be used if the material has lost its ferromagnetic property in its entirety as a result of, e.g., containing another diamagnetic material or non-magnetic material.

Figure 9:
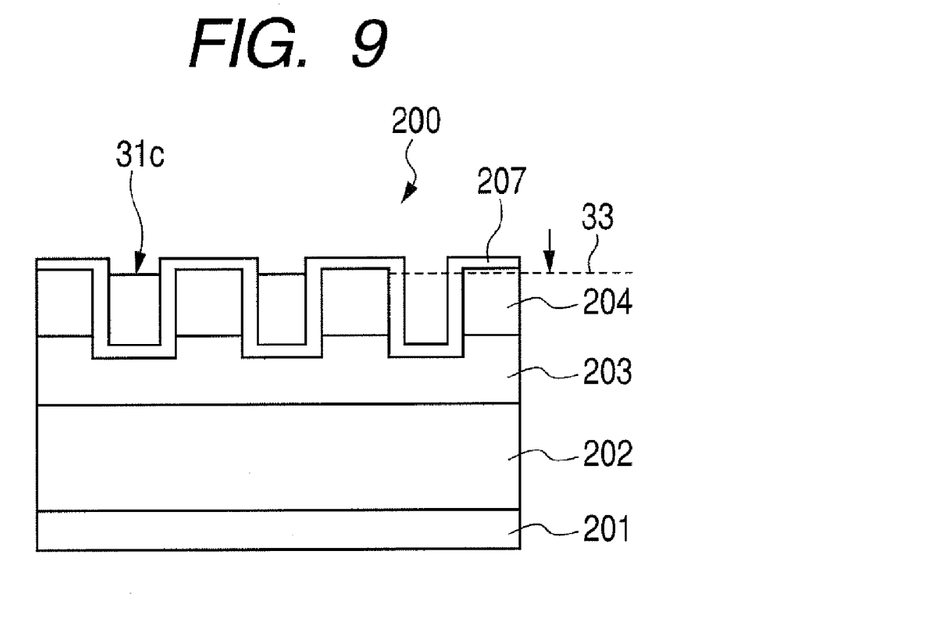
FIG. 9 is a schematic diagram for step-by-step illustration of a magnetic recording medium manufacturing method according to an embodiment of the present invention.

Although the method for depositing the buried layer 208 is not specifically limited, in the present embodiment, RF sputtering is performed by applying a bias voltage to the stack 200. In other words, a bias voltage is applied to the stop layer 207, which is a conductive layer, to deposit the buried layer 208, which includes a non-magnetic material, by means of sputtering. As described above, by means of applying a bias voltage, sputtered particles are drawn into the trenches 31b, preventing generation of voids. In this case, if the stop layer 207 includes a conductive material, a bias voltage can directly be applied to the surface on which the buried layer 208 is to be formed. For the bias voltage, for example, a direct-current voltage, an alternate-current voltage or a direct-current pulse voltage can be used. Also, although the pressure condition is not specifically limited, favorable burying performance can be obtained under the condition of a relative-high pressure of 3 to 10 Pa. Also, by means of performing RF sputtering with a high ionization rate, protrusions 32, on which a buried material can easily be deposited relative to the trenches 31b, can be subjected to etching simultaneously with deposition, using an ionized gas for discharge, enabling suppression of the difference in thickness between the films deposited on the trenches 31 and the protrusions 32. Although a buried material may be deposited in the trenches 31b, which are recesses, using collimate sputtering or low-pressure remote sputtering, use of the method according to the present embodiment enables the distance between the substrate 201 and the target to be shortened, and thus enabling downsizing of the apparatus. Next, as illustrated in FIG. 9, in a first etching chamber 118, the buried layer 208 is removed down to the level of the interface 33 between the recording magnetic layer 204 and the stop layer 207 (FIG. 12: step S103). In the present embodiment, the buried layer 208 is removed by means of ion beam etching using an inactive gas such as Ar gas as an ion source.

Figure 14:
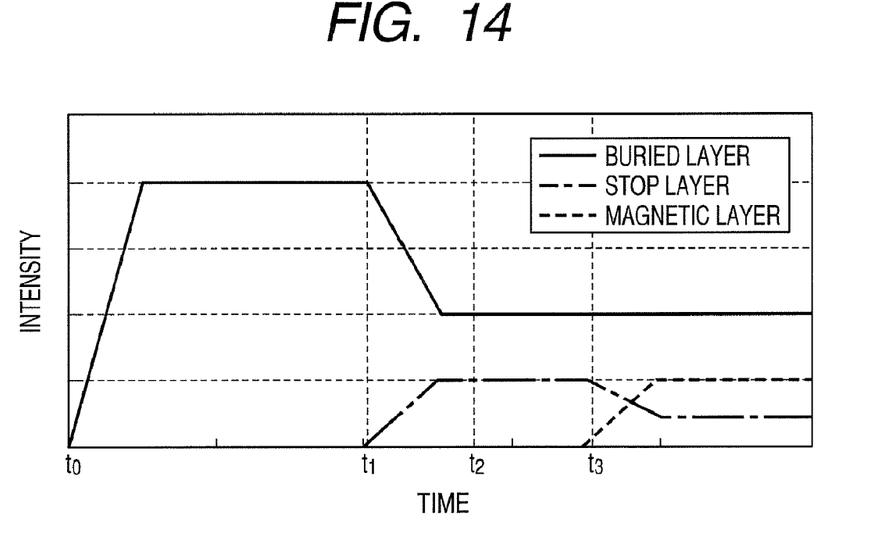
FIG. 14 is a diagram illustrating change in substances etched when performing ion beam etching, according to an embodiment of the present invention.

FIG. 14 illustrates change in substances etched when performing ion beam etching on the stack 200 illustrated in FIG. 8, in terms of the detected intensity using secondary ion mass spectrometry (SIMS). In the Figure, a solid line indicates the detected intensity of the buried layer, a dashed-dotted line indicates the detected intensity of the stop layer, and a dotted line indicates the detected intensity of the recording magnetic layer. As illustrated in FIG. 14, when starting etching at a time $t_0$, first, only the buried layer 208 is etched. Upon removal of the buried layer 208 on the recording magnetic layer 204 (time $t_1$) as a result of the etching proceeding, etching of the stop layer 207 on the recording magnetic layer 204 is started. Then, upon removal of the stop layer 207 on the recording magnetic layer 204 (time $t_3$), etching of the recording magnetic layer 204 is started. During the times $t_1$ to $t_3$, the buried layer 208, which has an etching rate higher than that of the stop layer 207, is etched more deeply than the stop layer 207, and thus, reaches the level of the interface 33 before the start of etching of the recording magnetic layer 204. In the present embodiment, the etching is terminated at a time $t_2$ between the times $t_1$ and $t_3$. Consequently, it is possible to prevent the recording magnetic layer 204 from being cut away.

Accordingly, it is possible to, for example, perform etching under the same etching conditions in advance to determine etching time from an etching start time $t_0$ to the time $t_2$ in advance, and when this predetermined etching time has elapsed, terminate etching. Alternatively, it is possible to detect the end point in real time using SIMS. Also, in consideration of the subsequent etching process, etching may be terminated at the point of time when it reaches a level slightly higher than the level of the interface 33. Also, not only ion beam etching, but also reactive ion etching may be performed under the conditions ensuring a large selectivity relative to the stop layer 207. The first etching chamber 118 includes the ion beam generators 1a and 1b illustrated in FIG. 1. This first etching chamber 118 is a chamber for removing a part of the buried layer 208 by means of ion beam etching.

Specific etching conditions may be, for example, a chamber pressure of no more than 1.0E-1 Pa, a V1 voltage of no less than +500 V, a V2 voltage of −500 to −2000 V, RF power in inductively-coupled plasma (ICP) discharge of around 200 W. As described above, provision of the stop layer 207 enables the recording magnetic layer 204 to be prevented from being etched during ion beam etching, and ensures removal of an extra portion of the buried layer 208 for planarization. Although the above description has been given in terms of straight-ahead ion beams, oblique incident ion beams may be used.

Figure 10:
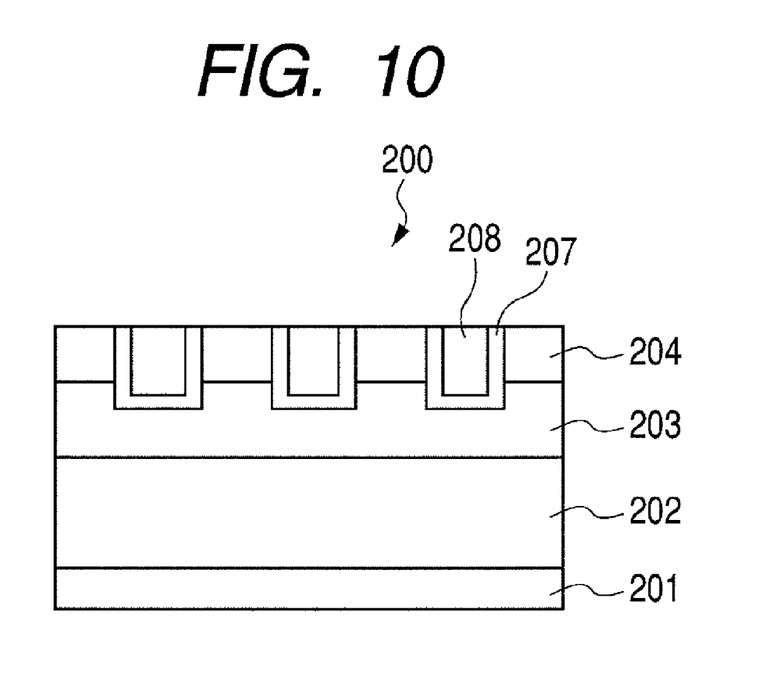
FIG. 10 is a schematic diagram for step-by-step illustration of a magnetic recording medium manufacturing method according to an embodiment of the present invention.

Next, in a second etching chamber 119, as illustrated in FIG. 10, the stop layer 207 stacked on the recording magnetic layer 204 is removed to planarize the surface of the stack 200 (FIG. 12: step S104). This second etching chamber 119 is a chamber for planarizing the stack 200 by means of reactive ion etching. Where carbon is used for the stop layer 207, only the stop layer 207 can selectively be removed by performing reactive ion etching using $O_2$ or $Ar+O_2$ for a reactive gas. In other words, the stop layer 207 can be removed while preventing the recording magnetic layer 204 and the buried layer 208 from being etched. Specific etching conditions may be, for example, application of a bias voltage (DC, pulsed-DC or RF), a chamber pressure of around 1.0 Pa, high-frequency power in ICP discharge of around 200 W, and a bias voltage of around −10 to −300 V. As described above, use of carbon as the stop layer 207 enables removal of the stop layer 207 by means of etching using oxygen. For example, when a metal is used for the stop layer 207, it may be necessary to use $CF_4$ as a reactive gas, and F adheres to the surface of the recording magnetic layer 204, entering what is called a corroded state. However, such state can be avoided by using carbon.

Although the stop layer 207 provided below the buried layer 208 remains in the trenches 31a, as described above, use of a nonmagnetic material such as carbon enables prevention of the influence on recording/reading to/from the recording magnetic layer 204.

Figure 11:
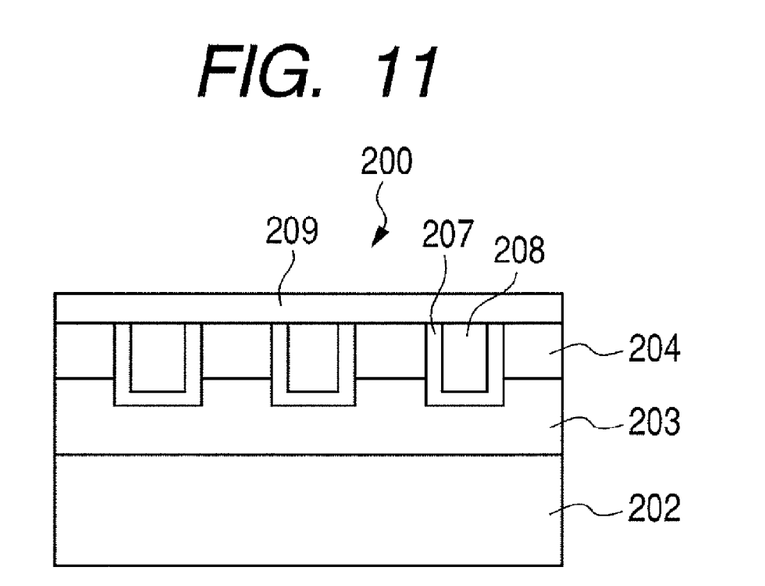
FIG. 11 is a schematic diagram for step-by-step illustration of a magnetic recording medium manufacturing method according to an embodiment of the present invention.

Next, as illustrated in FIG. 11, a DLC layer 209 is deposited on the planarized surface. In the present embodiment, this deposition is performed in a protective film formation chamber 121 after an adjustment to provide a temperature necessary for formation of DLC in a heating chamber 120 or a cooling chamber. The deposition conditions may be, for example, in parallel plate CVD, high-frequency power of 2000 W, a pulsed-DC bias voltage of −250 V, a substrate temperature of 150 to 200° C., a chamber pressure of around 3.0 Pa, use of $C_2H_4$ for a gas, and a flow rate of 250 sccm. ICP-CVD, etc., may also be used. While embodiments of the present invention have been described above, the present invention will not be limited to the above-described embodiments.

For example, if the mask 205 includes carbon, the method of leaving the mask 205 instead of formation of the stop layer 207 may be employed. However, in this case, the thickness of the mask 205 (=207) may be varied as a result of performing etching two times: etching for removing the resist layer 206 and etching for removing an extra portion of the buried layer 208. Accordingly, it is preferable to remove the mask 205 and newly form the stop layer 207 as in the above-described embodiment. This case is preferable because the stop layer 207 can be formed also on the bottom surfaces and the wall surfaces of the trenches 31a and it becomes easy to apply a bias voltage if a conductive material is used for the stop layer 207 as described above. Also, the description has been provided for the case of DTM, the present invention is not limited to this case. The present invention can be applied to, for example, the case where a buried layer is formed on a protruded and recessed pattern in BPM where a recording magnetic layer is scattered.

The present invention can be applied not only to a substrate processing apparatus (magnetron sputtering apparatus) described as an example, but also to, e.g., plasma processing apparatuses such as a dry etching apparatus, a plasma asher apparatus, a CVD apparatus and a liquid-crystal display manufacturing apparatus.

What is claimed is:

1. A substrate processing apparatus capable of applying an ion beam to a substrate including an opening to perform predetermined processing, the apparatus comprising:
   a first ion beam generator including a first ion extraction mechanism for extracting ions in a plasma; and
   a second ion beam generator including a second ion extraction mechanism for extracting ions in a plasma, the second ion beam generator being arranged opposite the first ion beam generator, wherein
   each of the first ion beam generator and the second ion beam generator is arranged so as to apply an ion beam to a region between the first ion beam generator and the second ion beam generator;
   the first extraction mechanism includes a first grid, and the second extraction mechanism includes a second grid; and
   when a substrate carrier that holds the substrate is arranged in the region, at least a part of an area of each of the first grid and the second grid, the area corresponding to the opening of the substrate, is occluded so as to prevent an ion beam from passing through the at least a part of the area.

2. A substrate processing apparatus capable of applying an ion beam to a substrate including an opening to perform predetermined processing, the apparatus comprising:
   a first ion beam generator including a first ion extraction mechanism for extracting ions in a plasma; and
   a second ion beam generator including a second ion extraction mechanism for extracting ions in a plasma, the second ion beam generator being arranged opposite the first ion beam generator, wherein
   each of the first ion beam generator and the second ion beam generator is arranged so as to apply an ion beam to a region between the first ion beam generator and the second ion beam generator;
   the first extraction mechanism includes a first grid, and the second extraction mechanism includes a second grid;
   the first grid includes a first occluded region, and the second grid includes a second occluded region; and
   when a substrate carrier that holds the substrate is arranged in the region, the first and second occluded regions are positioned so that at least a part of the opening is positioned between the first and second occluded regions.

3. A method for manufacturing a magnetic recording medium using the substrate processing apparatus according to claim 1, the method comprising the steps of:
   arranging a substrate carrier that holds a substrate including an opening in the region, the substrate carrier being arranged so that at least a part of the opening is positioned between the occluded region of the first grid and the occluded region of the second grid; and
   applying an ion beam to one surface to be processed of the substrate via the first ion beam generator, and applying an ion beam to another surface to be processed of the substrate via the second ion beam generator.

\* \* \* \* \*